US012640180B2

(12) United States Patent  
Friedman et al.

(10) Patent No.: US 12,640,180 B2  
(45) Date of Patent: May 26, 2026

(54) TOGGLE SOT-MRAM ARCHITECTURE WITH SELF-TERMINATING WRITE OPERATION

(71) Applicant: Board of Regents, The University of Texas System, Austin, TX (US)

(72) Inventors: Joseph S. Friedman, Dallas, TX (US); Naimul Hassan, Dallas, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 93 days.

(21) Appl. No.: 18/652,476

(22) Filed: May 1, 2024

(65) Prior Publication Data

US 2025/0342873 A1 Nov. 6, 2025

(51) Int. Cl.  
*G11C 11/16* (2006.01)

(52) U.S. Cl.  
CPC ........ *G11C 11/161* (2013.01); *G11C 11/1655* (2013.01); *G11C 11/1659* (2013.01); *G11C 11/1673* (2013.01)

(58) Field of Classification Search  
CPC .............. G11C 11/161; G11C 11/1655; G11C 11/1657; G11C 11/1659; G11C 11/1673; G11C 11/1675; H01F 10/3286; H10B 61/22; H10N 50/10; H10N 50/80  
See application file for complete search history.

(56) References Cited

U.S. PATENT DOCUMENTS

| | | | |
|---|---|---|---|
| 8,213,222 B2 | 7/2012 | Zheng et al. | |
| 8,363,460 B2 | 1/2013 | Abedifard et al. | |

| | | | |
|---|---|---|---|
| 9,589,619 B2 | 3/2017 | Lee et al. | |
| 9,997,226 B2 | 6/2018 | Qiu et al. | |
| 11,942,129 B2 | 3/2024 | Friedman et al. | |
| 2014/0347918 A1 | 11/2014 | Lee et al. | |
| 2016/0155485 A1 | 6/2016 | Dieny et al. | |

(Continued)

FOREIGN PATENT DOCUMENTS

| | | | | |
|---|---|---|---|---|
| KR | 20220082229 A | * | 6/2022 | ........... G11C 11/161 |
| WO | 2020223532 A1 | | 11/2020 | |

OTHER PUBLICATIONS

Lee et al., "Oscillatory spin-orbit torque switching induced by field-like torques," Communications Physics, 2018, 7 pages.

(Continued)

*Primary Examiner* — Jay W. Radke  
(74) *Attorney, Agent, or Firm* — Yee & Associates, P.C.

(57) ABSTRACT

A non-volatile magnetoresistive random-access memory device is provided. The device comprises a three-terminal spin-orbit torque magnetic tunnel junction (MTJ) with perpendicular anisotropy. The MTJ comprises a fixed ferromagnetic layer, a free ferromagnetic layer, a tunnel barrier between the fixed and free ferromagnetic layers, and a heavy metal layer under the free ferromagnetic layer. A read access transistor is connected to a first terminal of the fixed magnetic layer. A write access transistor is connected to a second terminal of the heavy metal layer. A ground voltage is connected to a third terminal of the heavy metal layer. A read bit line is connected to the read access transistor, and a read word line is connected to the gate of the read access transistor. A write bit line is connected to the write access transistor, and a write word line is connected to the gate of the write access transistor.

17 Claims, 13 Drawing Sheets

(56) References Cited

U.S. PATENT DOCUMENTS

| | | | |
|---|---|---|---|
| 2018/0040807 A1* | 2/2018 | Saito | H10N 50/10 |
| 2018/0240966 A1 | 8/2018 | Mihajlovic et al. | |
| 2019/0058112 A1 | 2/2019 | Chen et al. | |
| 2019/0058113 A1 | 2/2019 | Ramaswamy et al. | |
| 2019/0088860 A1* | 3/2019 | Saito | H10N 50/80 |
| 2019/0237119 A1* | 8/2019 | Sasaki | G11C 11/1675 |
| 2019/0244646 A1 | 8/2019 | Lee et al. | |
| 2020/0043538 A1 | 2/2020 | Mihajlovic et al. | |
| 2021/0210127 A1* | 7/2021 | Drouard | G11C 11/1675 |
| 2022/0319565 A1* | 10/2022 | Wu | G11C 11/1659 |
| 2025/0127063 A1* | 4/2025 | Song | H10N 50/20 |

OTHER PUBLICATIONS

Legrand et al., "Coherent Sub-Nanosecond Switching of Perpendicular Magnetization by the Field-like Spin-Orbit Torque without an External Magnetic Field," Physical Review Applied 3(6), 2015, 30 pages.

Pathak et al., "Impact of Spin-Orbit Torque on Spin-Transfer Torque Switching in Magnetic Tunnel Junctions," Scientific Reports, 2020, 8 pages.

PCT International Search Report and Written Opinion, dated Jul. 27, 2020, regarding Application No. PCT/US20/30808, 8 pages.

* cited by examiner

400

TABLE I WRITE
OPERATION TRUTH TABLE

| $D$ | $Q$ | $I_{D0}$ | $I_{D1}$ | $I_{FB} = I_{D0} \vee I_{D1}$ |
|---|---|---|---|---|
| 0 | 0 | 0 | 0 | 0 |
| 0 | 1 | 1 | 0 | 1 |
| 1 | 0 | 0 | 1 | 1 |
| 1 | 1 | 0 | 0 | 0 |

FIG. 7

TABLE II
CMOS PARAMETERS

| TYPE | COMMENT |
|---|---|
| $V_{dd}$ | 1.2 V |
| $R_{AP}$ | 3000 $\Omega$ |
| $R_P$ | 1000 $\Omega$ |
| $M_R$ | LENGTH = 60 nm, WIDTH = 4 $\mu$m |
| $M_W$ | LENGTH = 60 nm, WIDTH = 500 nm |
| $M_D$ | LENGTH = 60 nm, WIDTH = 8 $\mu$m |
| BUFFER | NUMBER OF INVERTERS = 4, PMOS WIDTH =3-4 $\mu$m, NMOS WIDTH = 0.5-1.5 $\mu$m, LENGTH = 60 nm |
| WRITE CIRCUIT | PMOS WIDTH = 1 $\mu$m, NMOS WIDTH = 1.5 $\mu$m, LENGTH = 60 nm |

FIG. 10

TOGGLE SOT-MRAM ARCHITECTURE WITH SELF-TERMINATING WRITE OPERATION

BACKGROUND INFORMATION

1. Field

The present invention relates in general to a novel device for magnetic random access memory based on spin-orbit torque switching.

2. Background

Magnetoresistive random-access memory (MRAM) is a potential solution for next-generation data storage due to its non-volatility, CMOS (complementary Metal-Oxide-Semiconductor) compatibility, and energy efficiency. The core of an MRAM bit cell is a magnetic tunnel junction (MTJ) that can be switched between high and low resistance states. Whereas the first generation of MRAM was switched by a magnetic field, modern MRAM is switched via electrical current through spin-transfer torque (STT) to provide increased density and write speed. In particular, STT-MRAM with perpendicular magnetic anisotropy (PMA) is preferred over in-plane anisotropy due to its higher density and increased thermal stability, which results in a longer data retention time. However, STT-MRAM has several limitations resulting from sharing the read and write path, including limited endurance and memory retention due to the degradation of the tunnel barrier from repeated switching.

Spin-orbit torque (SOT) switching has therefore been proposed to overcome this limitation by decoupling the read and write path. However, as the SOT produces a spin current polarized in the in-plane direction, it is non-trivial to deterministically switch an MTJ with PMA. While the application of an external in-plane magnetic field has been explored to break the SOT-PMA symmetry, it is preferable to achieve external field-free deterministic switching. Several approaches have been proposed to break the symmetry within the device stack, including deformation of the MTJ structure, an antiferromagnet-ferromagnet bilayer system, competing spin currents, five-terminal connectivity, and SOT currents of precise magnitude. Unfortunately, all of these approaches increase fabrication complexity, are highly sensitive to switching current duration and magnitude, or increase switching energy.

SUMMARY

An illustrative embodiment provides a non-volatile magnetoresistive random-access memory device, comprising at least one three-terminal spin-orbit torque magnetic tunnel junction (MTJ) with perpendicular anisotropy, wherein the MTJ comprises a fixed ferromagnetic layer, a free ferromagnetic layer, a tunnel barrier between the fixed and free ferromagnetic layers, and a heavy metal layer under the free ferromagnetic layer opposite the tunnel barrier. A read access transistor is connected to a first terminal connected to the fixed magnetic layer, and a write access transistor is connected to a second terminal connected to the heavy metal layer. A ground voltage is connected to a third terminal connected to the heavy metal layer. A read bit line is connected to the read access transistor, and a read word line is connected to the gate of the read access transistor. A write bit line is connected to the write access transistor, and a write word line is connected to the gate of the write access transistor.

Another illustrative embodiment provides a non-volatile magnetoresistive random-access memory array, comprising a number of rows and columns of three-terminal spin-orbit torque magnetic tunnel junctions (MTJs) with perpendicular anisotropy, wherein each MTJ comprises a fixed ferromagnetic layer, a free ferromagnetic layer, a tunnel barrier between the fixed and free ferromagnetic layers, and a heavy metal layer under the free ferromagnetic layer opposite the tunnel barrier. A ground voltage is connected to all the heavy metal layers of MTJs in the array. A number of read bit lines are connected to MTJs in the same columns of the array, wherein the read bits lines are connected to read access transistors connected to the fixed ferromagnetic layers of the MTJs. A number of read word lines are connected to MTJs in the same rows of the array, wherein the read bits lines are connected to gates of the read access transistors. A number of write bit lines are connected to MTJs in the same columns of the array, wherein the write bit lines are connected to write access transistors connected to the heavy metal layers of the MTJs. A number of write word lines are connected to MTJs in the same rows of the array, wherein the write bit lines are connected to gates of the write access transistors.

Another illustrative embodiment provides a method of reading from a magnetoresistive random-access memory array. The method comprises: applying a binary 0 signal to a single read word line connected to a selected row of magnetoresistive memory cells among a number of rows and columns of magnetoresistive memory cells in the array; applying binary 1 signals to respective read word lines connected to the other rows of magnetoresistive memory cells in the array; and applying binary 0 signals to respective write word lines connected to all the rows of magnetoresistive memory cells in the array. Each magnetoresistive memory cell comprises: a three-terminal spin-orbit torque magnetic tunnel junction (MTJ) with perpendicular anisotropy, wherein the MTJ comprises a fixed ferromagnetic layer, a free ferromagnetic layer, a tunnel barrier between the fixed and free ferromagnetic layers, and a heavy metal layer under the free ferromagnetic layer opposite the tunnel barrier; a read access transistor connected to a first terminal connected to the fixed magnetic layer, to a read bit line common to a column of the magnetoresistive memory cells, and to one of the read word lines at its gate; and a write access transistor connected to a second terminal connected to the heavy metal layer, to a write bit line common to the column of the magnetoresistive memory cells, and to one of the write word lines.

Another illustrative embodiment provides a method of writing to a magnetoresistive random-access memory array. The method comprises: applying a binary 0 signal to a single read word line connected to a selected row of magnetoresistive memory cells among a number of rows and columns of magnetoresistive memory cells in the array; applying a binary 1 signal to a write word line connected to the selected row of magnetoresistive memory cells; applying binary 1 signals to respective read word lines connected to the other rows of magnetoresistive memory cells in the array; and applying binary 0 signals to respective write word lines connected to all the other rows of magnetoresistive memory cells in the array. Each magnetoresistive memory cell comprises: a three-terminal spin-orbit torque magnetic tunnel junction (MTJ) with perpendicular anisotropy, wherein the MTJ comprises a fixed ferromagnetic layer, a free ferromagnetic layer, a tunnel barrier between the fixed and free ferromagnetic layers, and a heavy metal layer under the free ferromagnetic layer opposite the tunnel barrier; a read access transistor connected to a first terminal connected to the fixed magnetic layer, to a read bit line common to a column of the magnetoresistive memory cells, and to one of the read word lines at its gate; and a write access transistor connected to a second terminal connected to the heavy metal layer, to a write bit line common to the column of the magnetoresistive memory cells, and to one of the write word lines.

The features and functions can be achieved independently in various embodiments of the present disclosure or may be combined in yet other embodiments in which further details can be seen with reference to the following description and drawings.

BRIEF DESCRIPTION OF THE DRAWINGS

The novel features believed characteristic of the illustrative embodiments are set forth in the appended claims. The illustrative embodiments, however, as well as a preferred mode of use, further objectives and features thereof, will best be understood by reference to the following detailed description of an illustrative embodiment of the present disclosure when read in conjunction with the accompanying drawings, wherein:

FIG. 7 depicts a truth table for write operations in accordance with an illustrative embodiment;

FIG. 10 depicts a table of CMOS parameters for circuit simulation in accordance with an illustrative embodiment.

DETAILED DESCRIPTION

Figure 1:
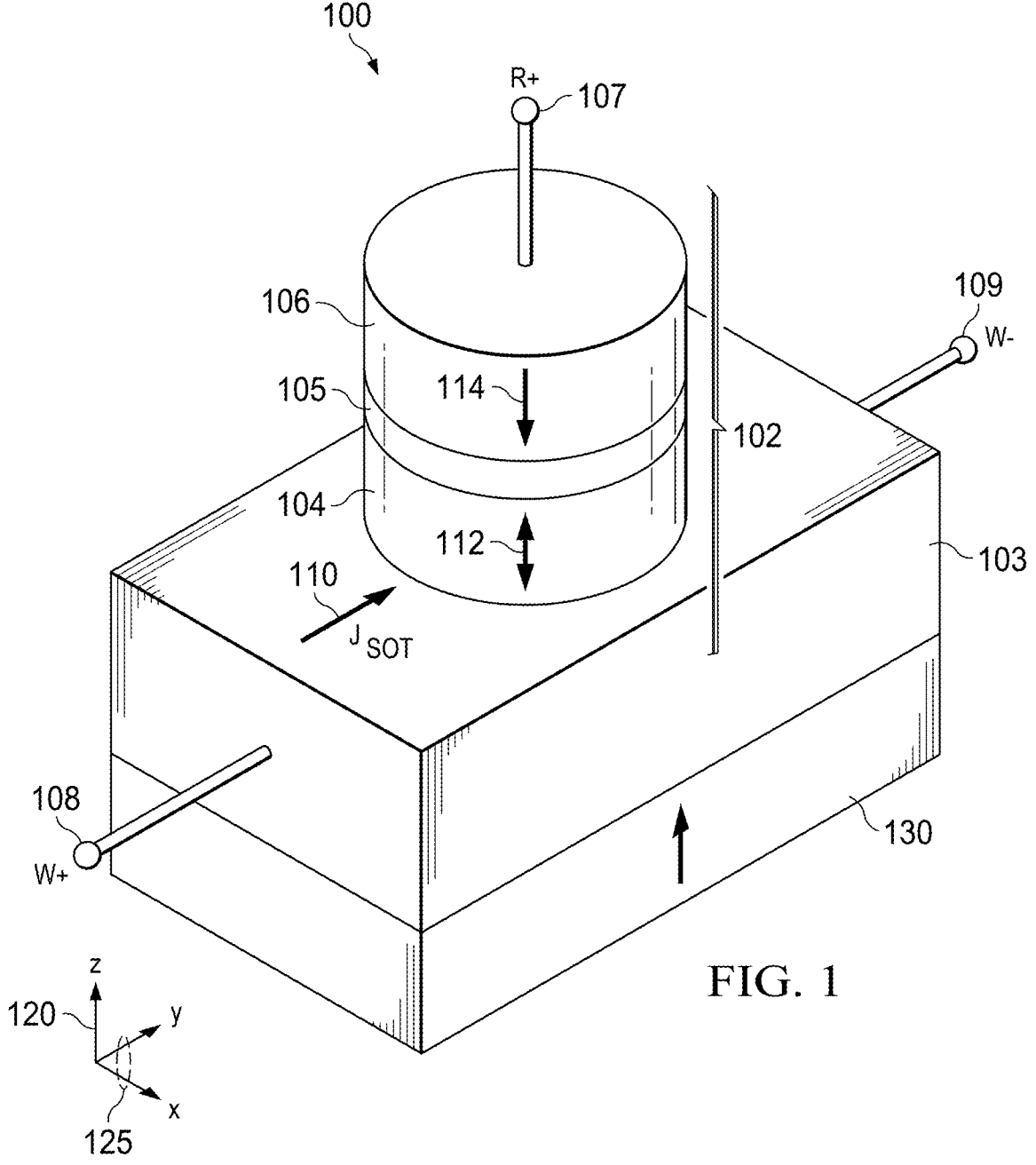
FIG. 1 illustrates a three-terminal, SOT-driven toggle MRAM with PMA in accordance with an illustrative embodiment.

The illustrative embodiments recognize and take into account that previous SOT-MRAM arrays primarily consider bit cells designed with directional in-plane SOT-MRAM that has shorter data retention compared to the PMA alternative. Moreover, the array proposals also suffer from one or more of the following circuit-level issues: absence of array-level integration between the bit cell and read-write drivers, multiplexing among analog voltage levels without proposing functional peripheral circuits, reduction in tolerance to the switching current variation for the requirement to carefully choose analog voltage levels in order to avoid bias temperature instability and erroneous writing by sneak path current, bit cells that are larger than 2T1R (two-translation and one-rotation), and multiple clock cycles to write a toggle SOT-MRAM bit cell in directional fashion due to the read-before-write requirement. These array proposals are therefore insufficient.

The illustrative embodiments also recognize and take into account that, to be considered for use in L3 cache, a non-volatile memory solution needs to show a writing speed below 10 ns.

The illustrative embodiments provide a novel SOT-MRAM architecture with a self-terminating write operation that efficiently leverages the robust write operation, long data retention, and simple material stack of field-free toggle PMA SOT-MRAM. The architecture integrates a custom read-write driver with an SOT-MRAM array without multiplexing among analog voltage levels and uses a minimal 2T1R bit cell. For the directional write operation, the driver performs simultaneous read and write in a single clock cycle with a feedback mechanism that is completed within 350 ps. This feedback mechanism also self-terminates the SOT write current and improves energy efficiency. To evaluate its feasibility and speed, we have performed an array-level SPICE (Simulation Program with Integrated Circuit Emphasis) simulation that demonstrates that this SOT-MRAM architecture is sufficiently fast for use as L3 cache.

The illustrative embodiments employ a simple SOT-MRAM structure with PMA wherein deterministic toggle switching is achieved without requiring additional device components. The toggle PMA SOT-MRAM exploits the precessional nature of field-like SOT to achieve field-free and energy-efficient switching with a simple structure that is robust to the switching current magnitude and duration. Leveraging SOT toggle switching, the illustrative embodiments apply unidirectional SOT current pulses that toggle the PMA SOT-MRAM between the parallel state (magnetization of fixed and free ferromagnets in the same direction) and anti-parallel state (magnetization of fixed and free ferromagnets in opposite directions). With this toggle switching, each SOT pulse flips the stored magnetization of the free ferromagnet, irrespective of its initial direction. The write circuit can use this toggle switching mechanism for selective directional switching. The toggle switching of the illustrative embodiments is in contrast to the bidirectional currents required for conventional SOT-MRAM devices with directional switching.

FIG. 1 illustrates a three-terminal, SOT-driven toggle MRAM with PMA in accordance with an illustrative embodiment. SOT-driven toggle MRAM 100 has a three-terminal magnetic tunnel junction (MTJ) 102 comprising a fixed ferromagnet 106 and free ferromagnet 104 separated by insulating tunnel barrier 105 that is sandwiched between the fixed ferromagnet 106 and free ferromagnet 104. The fixed ferromagnet layer 106 is adjacent a first side of the insulating tunnel barrier 105, and the free ferromagnet layer 104 is adjacent a second side of the insulating tunnel barrier opposite the fixed ferromagnet layer.

Both the free ferromagnet 104 and fixed ferromagnet magnet 106 have PMA, with a $\hat{z}$-directed easy axis 120, as indicated by arrows 112 and 114, and hard x-y plane 125. The magnetic anisotropy of the fixed ferromagnet 106 is in the $-\hat{z}$ direction approximately normal to a surface of the fixed ferromagnetic layer 106 with a fixed magnetization 114 generally aligned parallel to the easy axis normal to the interface between the fixed ferromagnet 106 and insulating tunnel barrier 105. The free ferromagnet layer 104 is disposed adjacent to the second surface of the tunnel barrier layer 105, defining an interface, having magnetic anisotropy approximately normal to the interface. The free ferromagnetic layer 104 has a bistable magnetization along the easy axis.

Fixed ferromagnet 106 and free ferromagnet 104 can each be made of different or similar materials, which can include, e.g., Co, Fe, Ni, Gd, Cr, CoFeB, NiFe, CoFe, (Co/Pd) n, CoTb, FeCoNi, Fe/Ni, Co/Ni/Co, YbFeO₃, NiMnGa, $La_{1-x}Ca_xMnO_3$, $La_{1-x}Sr_xMnO_3$, or any combination thereof. Tunnel barrier 105 can be made of, e.g., MgO, $Al_2O_3$, $Ta_2O_5$, RuO, or any combination thereof.

The respective diameters of the fixed ferromagnet 106, free ferromagnet 104, and tunnel barrier 105 can range from 2 nm to 200 nm each. For example, the respective diameters of the fixed ferromagnet 106, free ferromagnet 104, and tunnel barrier 105 can be at least 2 nm, such as at least 5 nm, at least 10 nm, at least 20 nm, at least 30 nm, at least 40 nm, and least 50 nm, at least 60 nm, at least 70 nm, at least 80 nm, at least 90 nm, or at least 90 nm. The respective diameters of the fixed ferromagnet 106, free ferromagnet 104, and tunnel barrier 105 can be not greater than 200 nm, such as not greater than 180 nm, not greater than 160 nm, not greater than 140 nm, not greater than 120 nm, not greater than 100 nm, not greater than 80 nm not greater than 70 nm, not greater than 60 nm, not greater than 50 nm, not greater than 40 nm, not greater than 30 nm, not greater than 20 nm, or even not greater than 10 nm. It will be appreciated that the respective diameters of the fixed ferromagnet 106, free ferromagnet 104, and tunnel barrier 105 can be within a range of any minimum or maximum value indicated above, and further appreciated that the respective diameters may be similar or different. In a particular embodiment, the respective diameters of the fixed ferromagnet 106, free ferromagnet 104, and tunnel barrier 105 can be within a range of 5 nm to 50 nm.

The respective thickness of fixed ferromagnet 106 and free ferromagnet 104 can be similar or different, and in some embodiments limited by atom/molecule size of material used. In accordance with an embodiment, the respective thickness of fixed ferromagnet 106 and free ferromagnet 104 can be at least 100 pm, such as at least 150 pm, at least 200 pm, at least 250 pm, at least 300 pm, at least 350 pm, at least 400 pm, at least 450 pm, at least 500 pm, at least 750 pm, at least 1 nm, at least 1.25 nm, at least 1.5 nm, or at least 1.75 nm. The respective thickness of fixed ferromagnet 106 and free ferromagnet 104 can be not greater than 2 nm, such as not greater than 1.75 nm, not greater than 1.5 nm, not greater than 1.25 nm, not greater than 1 nm, not greater than 750 pm, or not greater than 500 pm. It will be appreciated that the respective thickness of fixed ferromagnet 106 and free ferromagnet 104 can be within a range of any minimum or maximum value indicated above. In a particular embodiment, the respective thickness of fixed ferromagnet 106 and free ferromagnet 104 is within a range of 1 nm to 1.5 nm.

The thickness of the tunnel barrier 105 can be similar or different than the thickness of either the fixed ferromagnet 106 or free ferromagnet 104 and may be limited by atom/molecule size of material used. In accordance with an embodiment, the thickness of the tunnel barrier 105 can be at least 500 pm, such as at least 600 pm, at least 700 pm, at least 800 pm, at least 900 pm, or at least 1 nm. The thickness of the tunnel barrier 105 can be not greater than 1.5 nm, such as not greater than 1.25 nm, not greater than 1 nm, not greater than 900 pm, or not greater than 800 pm. It will be appreciated that the thickness of the tunnel barrier 105 can be within a range of any minimum or maximum value indicated above. In a particular embodiment, the thickness of the tunnel barrier 105 is within a range of 800 pm to 900 pm.

A heavy metal layer 103 can be disposed adjacent the free ferromagnet 104 on the side opposite the tunnel barrier 105. Heavy metal layer 103 can be made of, e.g., Pt, Ta, W, Cu, TaN, CuIr, Hf, or any combination thereof. The respective width and length of heavy metal layer 103 can be within a range of any minimum or maximum diameter of the free ferromagnet 104 disclosed herein and may further be selected depending on connectivity requirements. According to an embodiment, the width and/or length of heavy metal layer 103 can be at least 5 nm, such as at least 10 nm, at least 20 nm, at least 30 nm, at least 40 nm, at least 50 nm, at least 60 nm, and not greater than 100 nm, not greater than 90 nm, not greater than 80 nm, not greater than 70 nm, not greater than 60 nm, or not greater than 50 nm. In an embodiment, the thickness of heavy metal layer 103 may be limited by atom/molecule size of material used. In an embodiment, the thickness of heavy metal layer 103 can be at least 150 pm, at least 200 pm, at least 250 pm, at least 300 pm, at least 350 pm, at least 400 pm, at least 450 pm, at least 500 pm, at least 750 pm, at least 1 nm, at least 1.25 nm, at least 1.5 nm, at least 1.75 nm, at least 2 nm, at least 3 nm, at least 4 nm, at least 5 nm, at least 6 nm, at least 7 nm, at least 8 nm, at least 9 nm, or at least 10 nm. The heavy metal layer 103 can be not greater than 11 nm, such as not greater than 11 nm, not greater than 10 nm, not greater than 9 nm, not greater than 8 nm, not greater than 7 pm, not greater than 6 nm, not greater than 5 nm. It will be appreciated that the heavy metal layer 103 can be within a range of any minimum or maximum value indicated above. In a particular embodiment, the heavy metal layer 103 is within a range of 1.5 nm to 5 nm.

Magnetic tunnel junction 102 further comprises a read terminal R+ 107 coupled to fixed ferromagnet 106, positive write terminal W+ 108 attached to one section of the heavy metal 103, and negative write terminal W– 109 attached to another section of the heavy metal for connecting electrical signals, voltages, and currents. Write terminals W+ 108 and W– 109 are disposed with respect to each other such that when SOT electrical current 110 ($J_{SOT}$) flows through heavy metal 103 from W+ 108 to W– 109, $J_{SOT}$ induces spin-orbit torque (SOT) on adjacent free ferromagnet 104.

The SOT induced by current 110 flowing from write terminal W+ 108 to write terminal W– 109 switches the magnetization of the free ferromagnet 104. When the magnetization of the free ferromagnet 104 switches, the electrical resistance between the read terminal R+ 107 and the W-terminal 109 can be switched between two stable resistance states. The bistable magnetization of the free ferromagnet layer 104 can be in one of two stable resistance states comprising a parallel state in which the bistable magnetization is generally parallel to the fixed magnetization of the fixed ferromagnet layer 106, and an anti-parallel state in which the bistable magnetization is generally anti-parallel to the fixed magnetization of the fixed ferromagnet layer 106.

The magnetization 112 of the free ferromagnet 104 can toggle between the two stable resistance states in the $+\hat{z}$ and $-\hat{z}$ directions, respectively, by applying the unidirectional current 110 through the write path from terminal W+ 108 to terminal W− 109. The two stable resistance states of MTJ 102 include a low resistance state that corresponds to the parallel state and a high resistance state that corresponds to the anti-parallel state. The resistance states are switched as a result of spin-orbit torque exerted by electrical current pulse 110 on the free ferromagnet 104 followed by relaxation to an easy axis of the free ferromagnet. Each time a subsequent electrical current pulse 110 flows through the heavy metal layer 103, the free ferromagnet 104 toggles once between the parallel and antiparallel states that result in the low and high electrical resistance states, respectively.

The state of the MTJ 102 can be read by applying a voltage between read terminal R+ 107 and write terminal W− 109. The resistance state of MTJ 102 is determined by a tunneling magnetoresistance effect on the current applied through the read path from R+ 107 to W− 109.

In an embodiment, a compensating ferromagnet 130 can be disposed adjacent the heavy metal 103 on the side opposite the free ferromagnet 104 for stray dipolar field cancellation. The presence of a stray dipolar field acting upon the free ferromagnet 104 (e.g., a stray dipolar field provided by the fixed ferromagnet 106) can act to decrease the toggle range when an initial magnetization state of the free ferromagnet 104 is parallel to the stray dipolar field, or increase the toggle range when the initial magnetization state of the free ferromagnet 104 is antiparallel to the stray dipolar field. In accordance with an embodiment, the compensating ferromagnet 130 can provide a compensating dipolar field to counteract a stray dipolar field greater than 1.0 mT, such as greater than 1.5 mT, greater than 2.0 mT, greater than 2.5 ml, greater than 3.0 mT, greater than 3.5 mT, greater than 4.0 ml, or even greater than 4.5 mT.

Figure 2A:
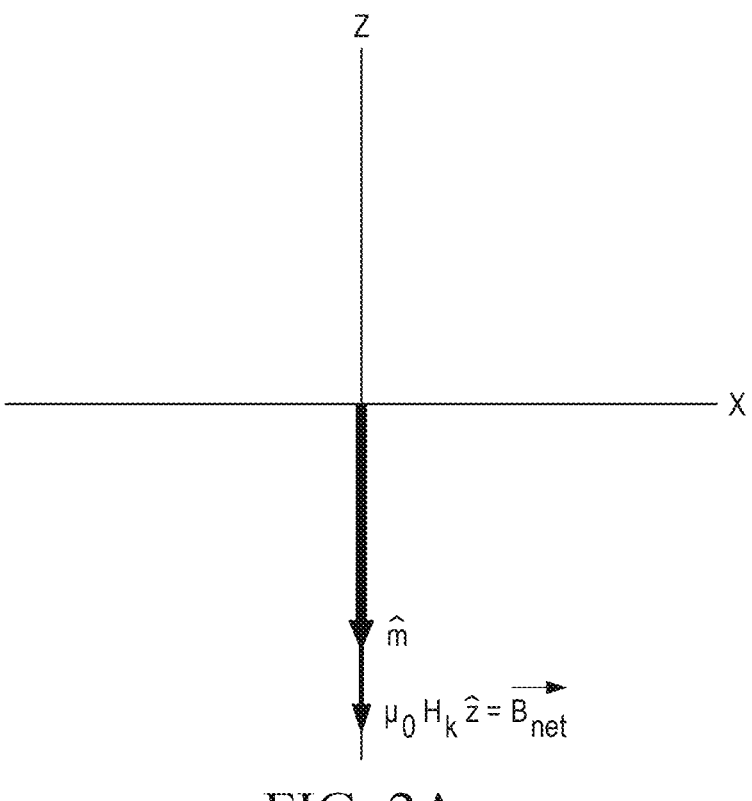
FIG. 2A illustrates free ferromagnet magnetization $\hat{m}$ in an initially relaxed state at $-\hat{z}$ direction before the application of SOT excitation in accordance with an illustrative embodiment.

FIGS. 2A-2F are a set of graphical plots illustrating the magnetization switching mechanism underlying the toggle switching process for SOT-driven toggle MRAM. FIG. 2A illustrates free ferromagnet magnetization $\hat{m}$ in an initially relaxed state at $-\hat{z}$ direction before the application of SOT excitation. FIG. 2A represents a low magnetoresistance state wherein both magnetizations of the free ferromagnet and fixed ferromagnet are stable in the $-\hat{z}$ direction.

Figure 2B:
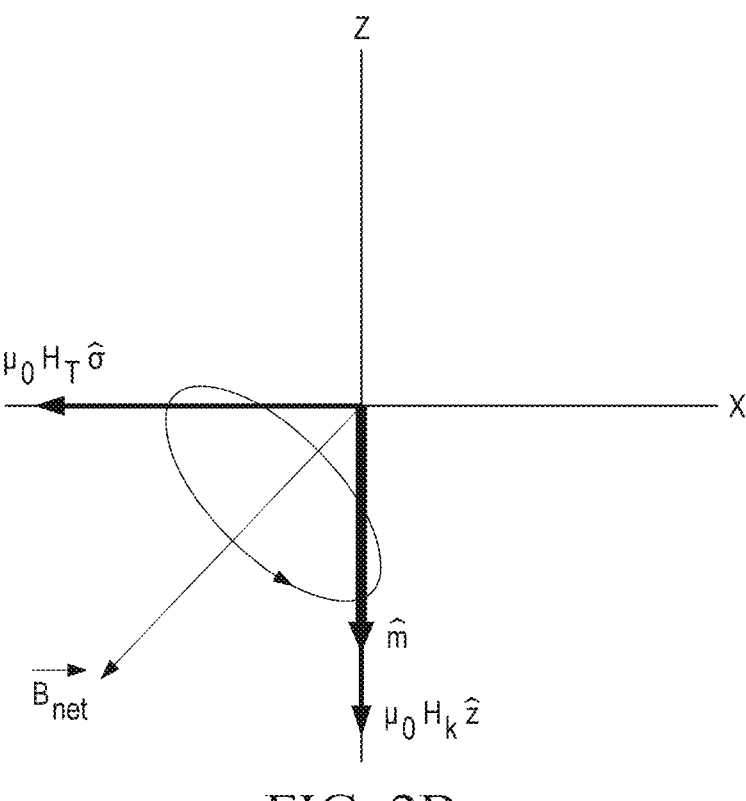
FIG. 2B illustrates the precession of the magnetization of the free ferromagnet when a write current is applied through the heavy metal in accordance with an illustrative embodiment.

FIG. 2B illustrates the precession of the magnetization of the free ferromagnet when a write current is applied through the heavy metal.

As shown in FIG. 2B, the interplay between the PMA field $\mu_0 H_k \hat{z}$, and the field-like SOT $\mu_0 H_T \hat{\sigma}$ causes $\hat{m}$ to precess around the net magnetic field $\vec{B}_{net}$ of the system.

Figure 2C:
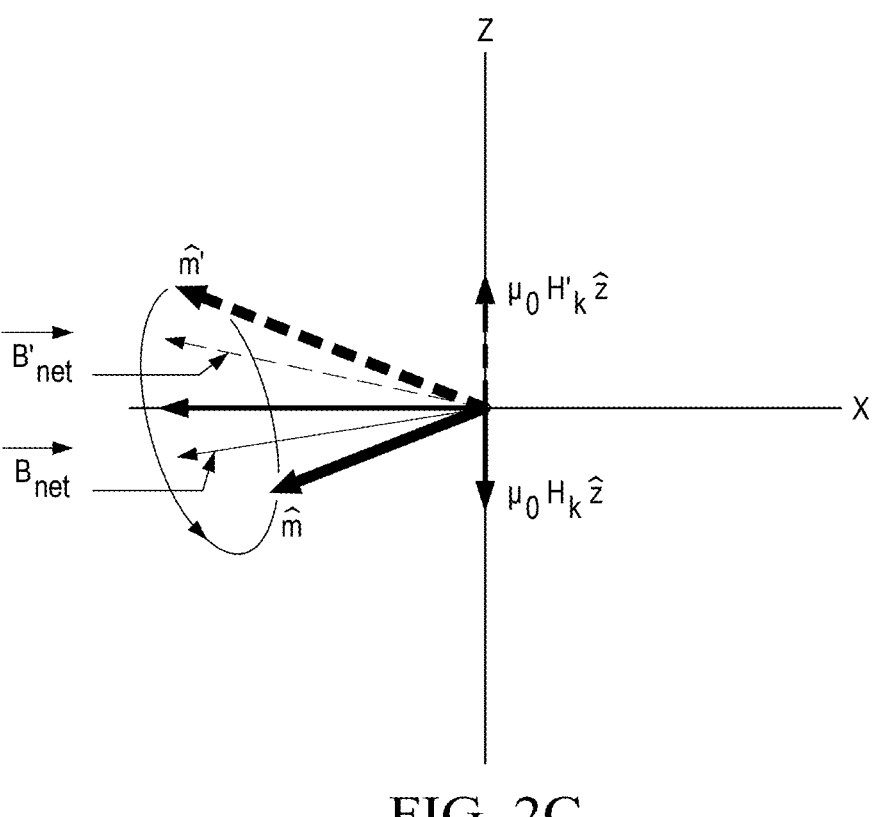
FIG. 2C illustrates the magnetization of the free ferromagnet crossing the hard x-y plane as it precesses in accordance with an illustrative embodiment.

FIG. 2C illustrates the magnetization of the free ferromagnet crossing the hard x-y plane as it precesses. Gilbert damping decreases the radius of the circular trajectory and applies a torque on $\hat{m}$ to align it along $\vec{B}_{net}$. The magnitude and direction of $\vec{B}_{net}$ also changes due to the varying perpendicular magnetic anisotropy field $\mu_0 H_{K,eff} m_z \hat{z} = \mu_0 H_K \hat{z}$.

Figure 2D:
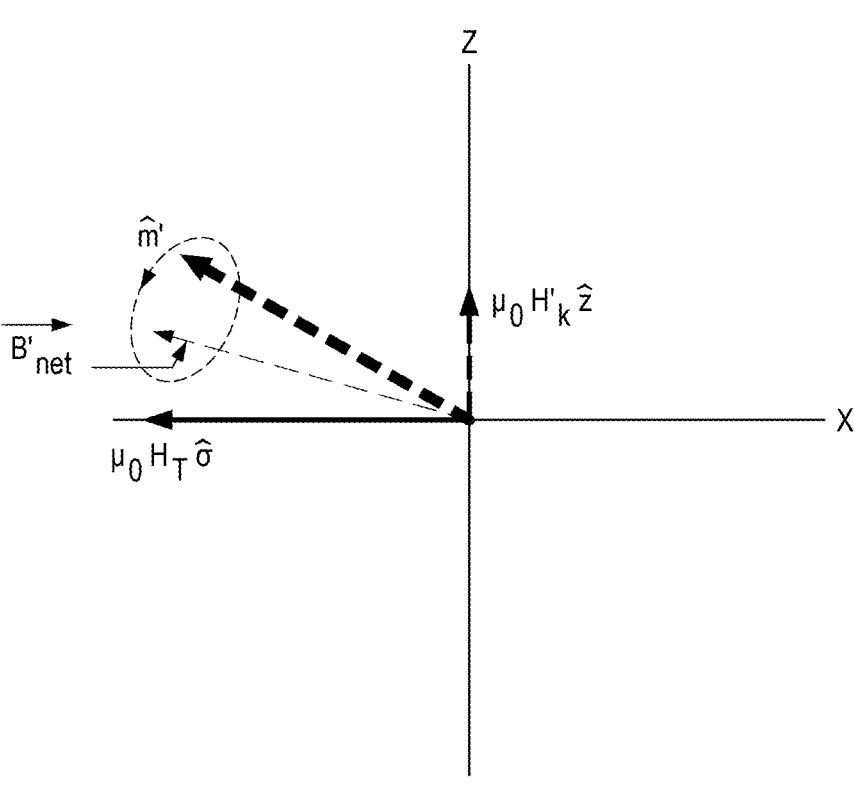
FIG. 2D illustrates both the magnetization and net magnetic field crossing the hard x-y plane in accordance with an illustrative embodiment.

As shown in FIG. 2D, the precessional and damping forces cause both the free ferromagnet magnetization $\hat{m}$ and net magnetic field $\vec{B}_{net}$ to cross the hard x-y plane.

Figure 2E:
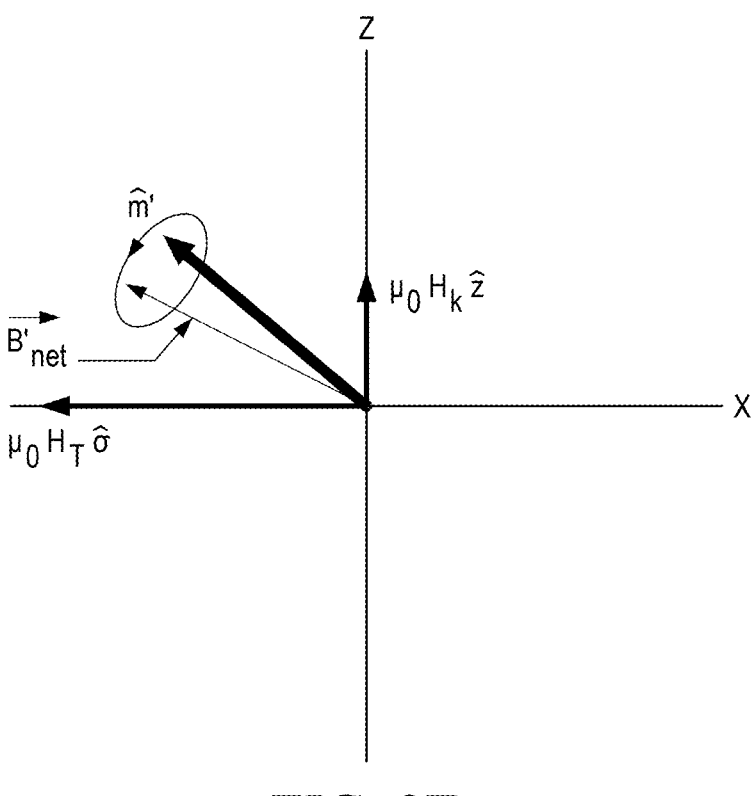
FIG. 2E illustrates the magnetization $\hat{m}$ of the free ferromagnet reaching a stable excited state in accordance with an illustrative embodiment.

FIG. 2E illustrates the magnetization $\hat{m}$ of the free ferromagnet reaching a stable excited state. The radius of the circular trajectory approaches zero with $\hat{m}$ and $\vec{B}_{net}$ across the hard x-y plane, causing $\hat{m}$ to reach a stable excited state with positive z magnetization not aligned with the easy axis.

Figure 2F:
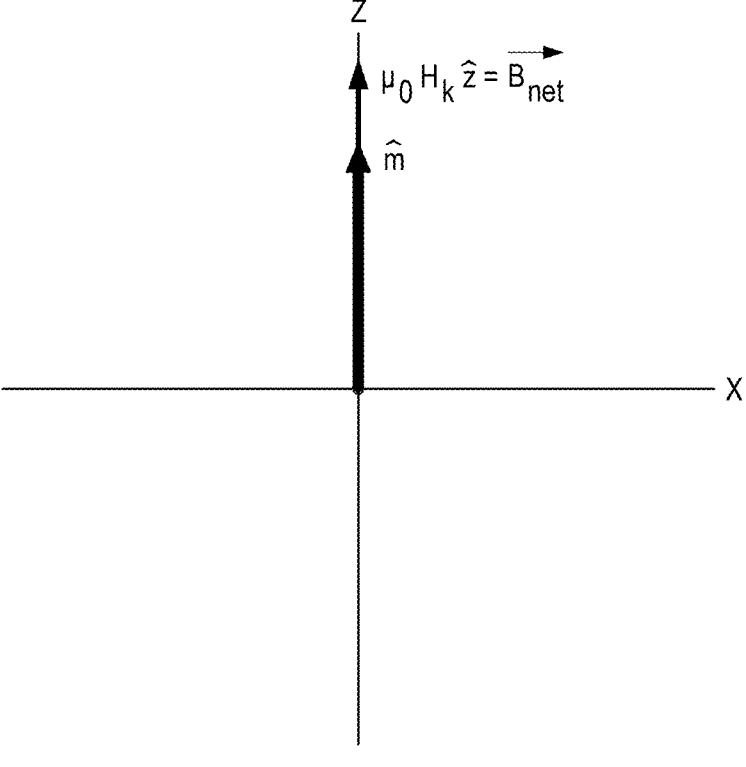
FIG. 2F illustrates the magnetization $\hat{m}$ of the free ferromagnet in the $+\hat{z}$ direction when the SOT excitation is removed in accordance with an illustrative embodiment.

FIG. 2F illustrates the magnetization $\hat{m}$ of the free ferromagnet in the $+\hat{z}$ direction when the SOT excitation is removed. As shown in FIG. 2F, switching off the SOT excitation causes $\hat{m}$ to relax in the $+\hat{z}$ direction (the nearest easy axis direction), opposite the initial state, thereby switching the MTJ to a high magnetoresistance state.

When the next write current is applied, the magnetization $\hat{m}$ of the free ferromagnet will toggle back to the $-\hat{z}$ direction. As $\hat{m}$ crosses the hard x-y plane exactly once during each application of a SOT current, the MTJ toggles between the parallel and antiparallel states every time a SOT current is applied.

Figure 3:
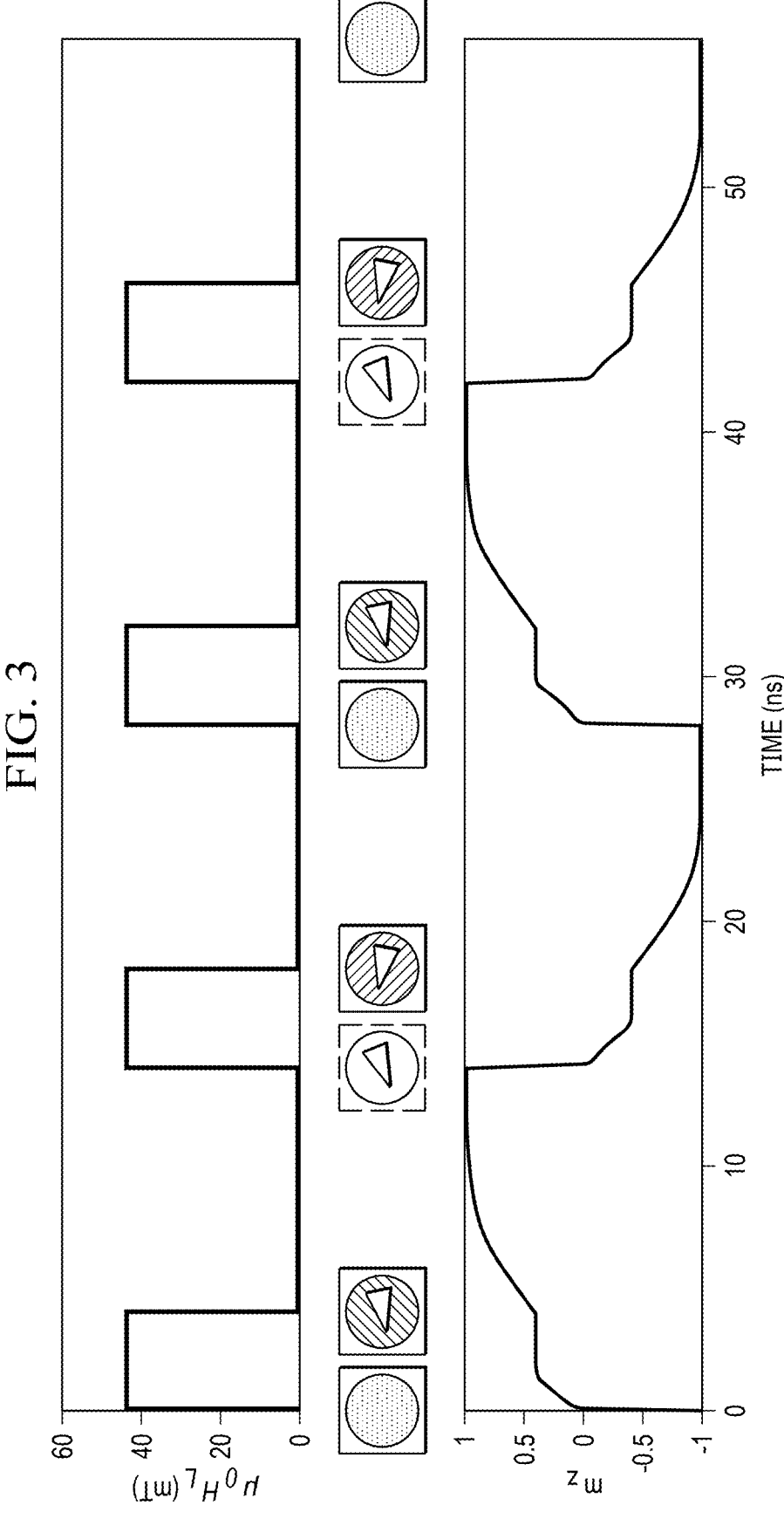
FIG. 3 depicts graphs illustrating multiple magnetization toggles in accordance with an illustrative embodiment.

FIG. 3 depicts graphs illustrating multiple magnetization toggles in accordance with an illustrative embodiment. As shown in FIG. 3, multiple 4 ns SOT currents with 10 ns of relaxation between each pulse are applied with magnetic field $\mu_0 H_L$ (upper graph) causing $\hat{m}_z$ to toggle with each applied SOT current pulse (lower graph). The micromagnetic simulation screenshots between the upper and lower graphs demonstrate the switching between the $+\hat{z}$ and $-\hat{z}$ directions.

In the illustrative embodiments, the pulse width of the unidirectional current used for toggling, or SOT pulse, can have a minimum duration of at least 100 ps, at least 200 ps, at least 300 ps, at least 400 ps, at least 500 ps, at least 600 ps, at least 700 ps, at least 800 ps, at least 900 ps, at least 1 ns, at least 2 ns, at least 3 ns, at least 4 ns, at least 5 ns, at least 6 ns, at least 7 ns, at least 8 ns, at least 9 ns, or at least 10 ns. It will be appreciated that the pulse width of the unidirectional current used for toggling can be within a range of any value indicated above.

Insufficient relaxation time between pulses of the unidirectional current used for toggling, or SOT pulses, may cause failure of toggle switching to occur. A separation of 1 ns is insufficient to relax $\hat{m}$ vertically. As a result, the angular difference between $\hat{m}$ and $\hat{\sigma}$ after the 1 ns relaxation period was insufficient for precessional torque to cause $\hat{m}$ to cross the hard x-y plane.

In accordance with an embodiment, the separation between successive electric current pulses, or the pulse separation width, can have a duration of at least 0.5 ns, at least 1 ns, at least 2 ns, at least 3 ns, at least 4 ns, at least 5 ns, at least 6 ns, at least 7 ns, at least 8 ns, at least 9 ns, or at least 10 ns. It will be appreciated that the pulse separation width can have a duration within a range of any value indicated above.

The toggle SOT MRAM device 100 is highly robust to the switching current magnitude and duration, thereby simplifying the write circuit and improving system efficiency. In particular, the switching mechanism can tolerate write current imprecision greater than 50% and rise times slower than 200 ps. Furthermore, the device structure consists of a minimal number of planar layers, thereby simplifying fabrication and increasing the potential for continued MRAM scaling. The toggle SOT MRAM device 100 thus provides the first robust approach to simultaneously leverage the energy-efficiency of SOT and the thermal stability of PMA without requiring complex fabrication or an external magnetic field.

Figure 4:
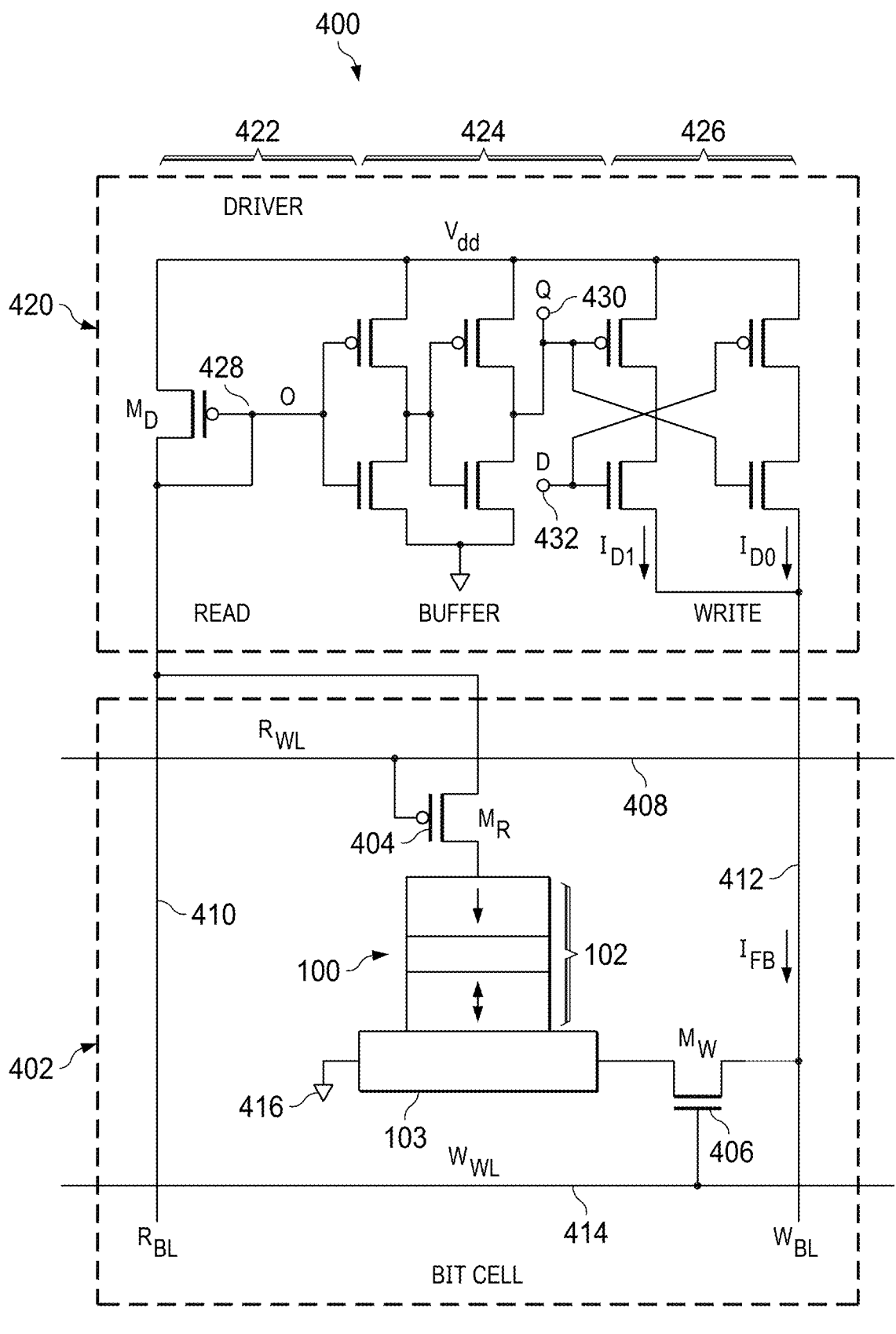
FIG. 4 depicts a diagram of a single-bit toggle SOT-MRAM cell integrated with a read-write drive in accordance with an illustrative embodiment.

FIG. 4 depicts a diagram of a single-bit toggle SOT-MRAM call integrated with a read-write drive in accordance with an illustrative embodiment. The integrated memory architecture 400 is custom designed starting from a bit cell 402 that incorporates a toggle SOT-MRAM 100 and two transistors $M_R$ 404 and $M_W$ 406. To sense the resistance state of the MTJ 102, read access transistor $M_R$ 404 is gated by the read word line signal $R_{WL}$ 408 and connects the SOT-MRAM 100 (at the transistor drain) to the read bit line $R_{BL}$ 410 (at the transistor source). To apply the unidirectional SOT current through the heavy metal layer 103, transistor $M_W$ 406 connects the SOT-MRAM 100 (at the transistor source) to the write bit line $W_{BL}$ 412 (at the transistor drain) and is gated by the write word line signal $W_{WL}$ 414. The other end of the heavy metal layer 103 is connected to the system ground, GND 416.

The integrated memory architecture 400 performs two operations: 1) reading data (Q) stored in a target bit cell and 2) writing incoming data (D) into a target bit cell. While previous designs require more than one clock cycle to write a toggle memory due to a read-before-write requirement, the integrated memory architecture 400 increases the speed of the write operation by performing the read and write within a single clock cycle. The ability to perform the read and write within a single clock cycle is made possible by the driver circuit 420, which includes a self-terminating SOT-inducing current.

The driver circuit 420 comprises three individual parts: read circuit 422, buffer circuit 424, and write circuit 426. The read circuit 422 reads the data from the bit cell 402 as an analog voltage at node O 428. The buffer circuit 424 amplifies that voltage to logical '1' or '0' at node Q 430. The write circuit 426 writes incoming data D 432 to the bit cell 402 by producing a self-terminating feedback current that induces SOT to switch the MTJ state.

Figure 5A:
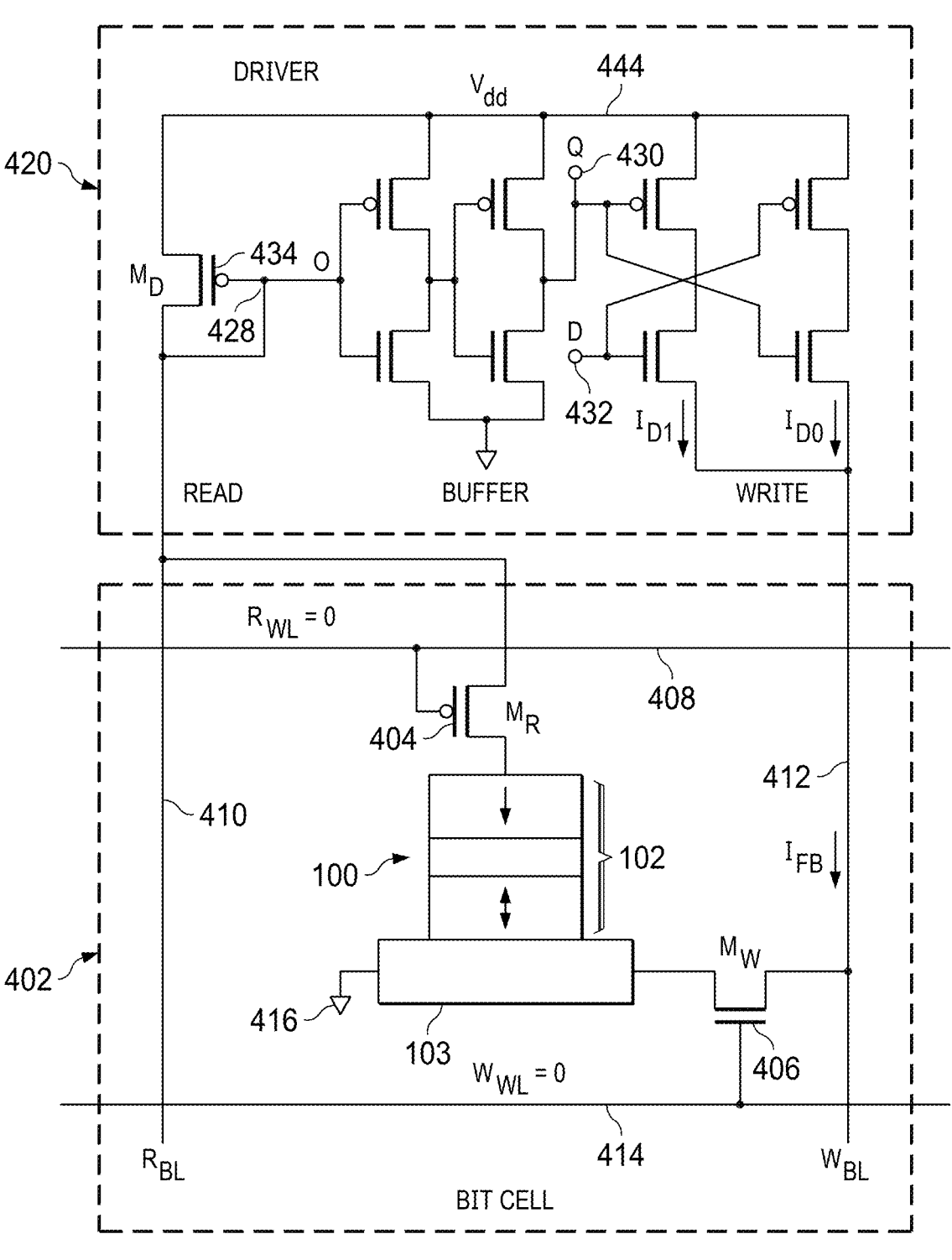
FIG. 5A depicts a read operation performed on a bit cell in accordance with an illustrative embodiment.
Figure 5B:
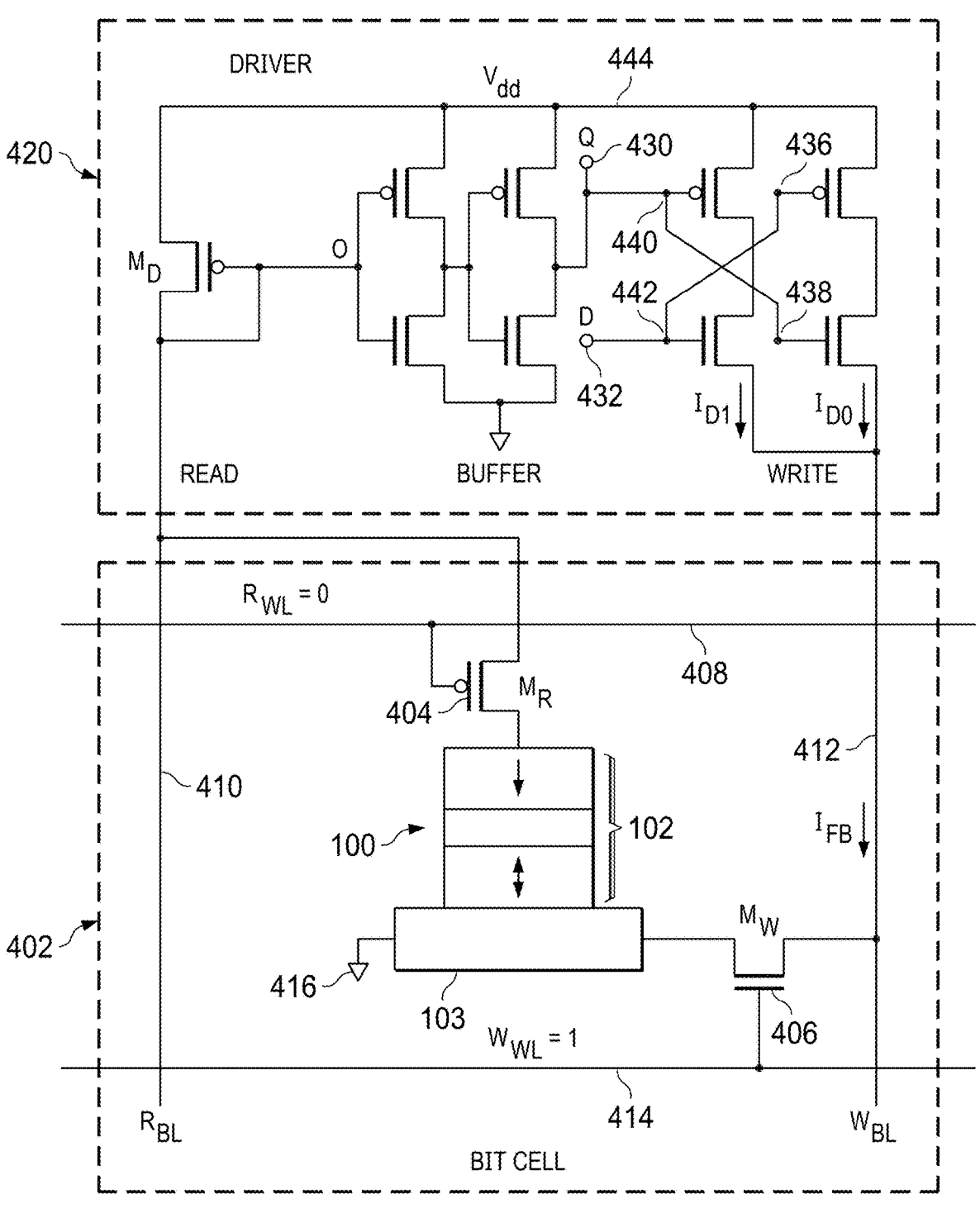
FIG. 5B depicts a write operation performed on a bit cell in accordance with an illustrative embodiment.

FIG. 5A depicts a read operation performed on a bit cell in accordance with an illustrative embodiment. FIG. 5B depicts a write operation performed on a bit cell.

The read operation is performed by activating the read word line $R_{WL}$ 408 of the target bit cell 402 with logical '0' in order to turn on the PMOS (P-type metal-oxide-semiconductor) read-access transistor $M_R$ 404. Turning on read-access transistor $M_R$ 404 connects the MTJ 102 of the bit cell 402 to the diode-connected PMOS transistor $M_D$ 434 at its shorted drain-gate terminal (node) O 428 through the read bit line $R_{BL}$ 410. The source terminal $M_D$ 434 is connected to voltage $V_{dd}$ 444. Therefore, a voltage divider is formed between $V_{dd}$ 444 and GND 416 by the MTJ 102 in the target bit cell 402 and diode-connected $M_D$ 434 load. The voltage divider output at node O 428 depends on the MTJ resistance state. For the high resistance state, node O 428 outputs a higher sense voltage in comparison to the low resistance state. These analog voltage levels do not saturate to logical $V_{dd}$ (logical '1') or GND (logical '0'), instead falling between these values.

The voltage sensed by the read circuit 422 at node O 428 needs an analog-to-digital conversion in order to interface the memory unit with a binary processing unit. For such conversion, the sense voltage needs encoding to logical '1' or '0'. A chain of inverters performs the encoding by buffering the analog voltage. The threshold of the inverters depends on the margin between the high and low analog voltage levels sensed at node O 428. Eventually, the buffer circuit 424 outputs logical '1' ($V_{dd}$) or '0' (GND) at node Q 430 for the high and low analog voltage levels respectively.

This logical output at node Q 430 is the binary representation of the bit cell state passed through the read circuit 422 and buffering circuit 424 stages. For high and low resistance states of the bit cell 402, the binary output is logical '1' and '0', respectively. Throughout the entire read operation, the write bit line $W_{WL}$ 414 of the target bit cell 402 remains at logical '0' to keep the NMOS (n-type metal-oxide-semiconductor) transistor $M_W$ 406 off such that the bit cell 402 is prevented from writing.

Figure 6:
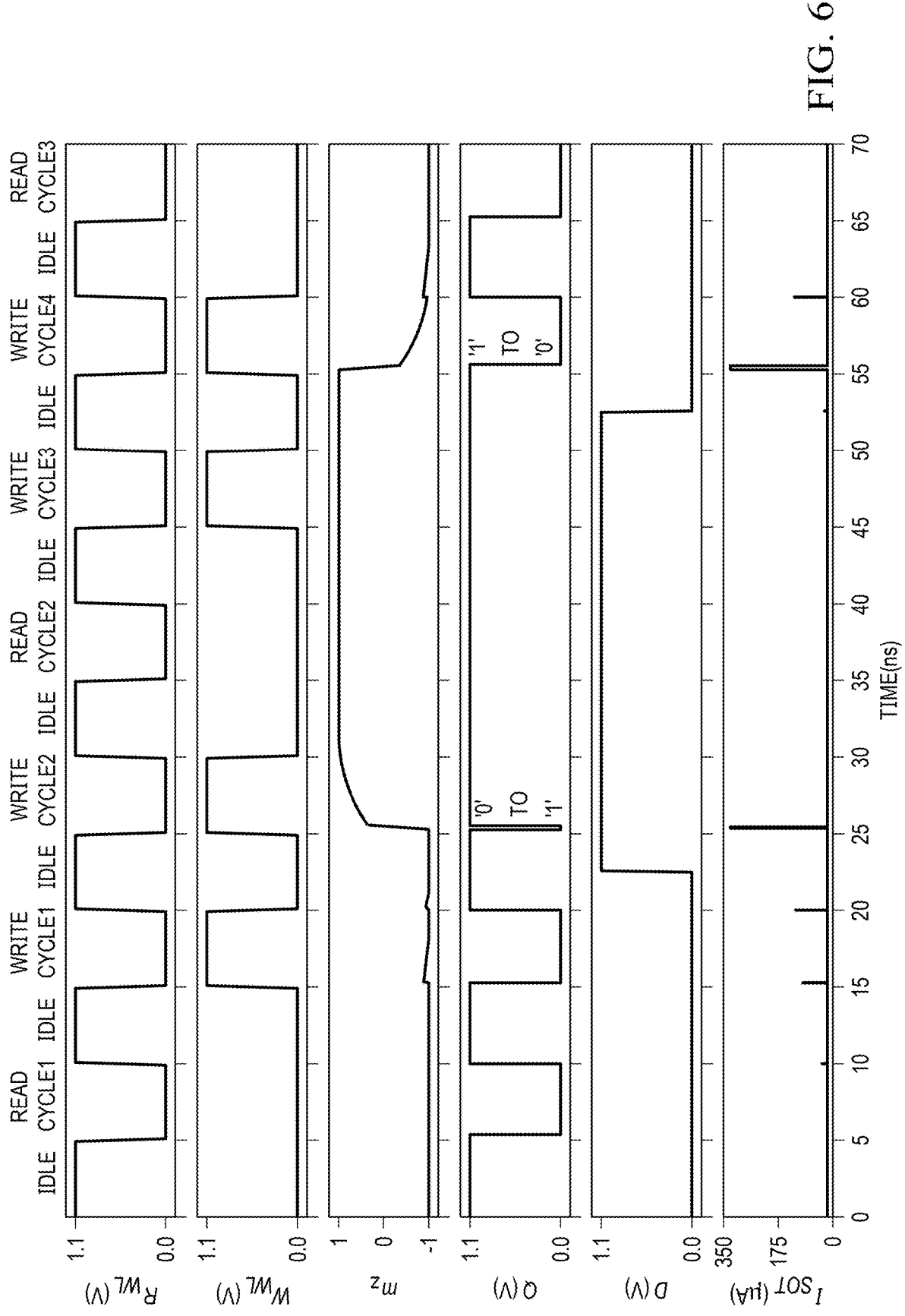
FIG. 6 depicts a graph of a simulation of read and write cycles for a toggle SOT-MRAM bit cell in accordance with an illustrative embodiment.

FIG. 6 depicts a graph of a simulation of read and write cycles for a toggle SOT-MRAM bit cell in accordance with an illustrative embodiment. The single-bit simulation shown in FIG. 6 includes three read cycles and four write cycles, separated by seven idle periods.

During the idle periods, both read word line $R_{WL}$ and write word line $W_{WL}$ are deactivated with 1.1 V (logical '1') and 0 V (logical '0'), respectively. During the idle periods, the buffer circuit outputs logical '1' (1.1 V) at node Q due to the nature of the read and buffer circuit connection. In the simulation, the MTJ in the bit cell is initiated in a parallel low resistance state represented by $m_z=-1$. During read cycle 1, $R_{WL}$ is activated by switching from '1' to '0'; therefore, node Q switches from idle '1' to '0' by reading the data stored in the SOT-MRAM bit cell. Following toggle write cycles 2 and 4, the output node Q produces logical '1' and '0' during read cycles 2 and 3, respectively.

Referring now to FIG. 5B, the write operation is performed with a simultaneous read operation in a single clock cycle. Therefore, both $R_{WL}$ 408 and $W_{WL}$ 414 of the target bit cell 402 are simultaneously activated with logical '0' and '1', respectively. As shown in FIG. 5B, this turns on the read and write access transistors $M_R$ 404 and $M_W$ 406. The read circuit 422 portion of the driver circuit 420 is the same as described above and outputs the stored data at output node Q 430 of the buffer circuit 424 within the driver circuit 420. The inputs to the write circuit 426 are the incoming data D 432 and the stored data from the selected bit cell readout at node Q 430. The write circuit 426 has two branches that carry currents $I_{D0}$ and $I_{D1}$ to write D='0' and '1', respectively. The sum $I_{FB}$ of the two branch currents is fed back to the selected bit cell that is being read out at node Q 430. Activating the write word line $W_{WL}$ 414 applies the $I_{FB}$ toggle switching current to the heavy metal layer 103 of the toggle MRAM 100 within the selected bit cell 402 through the write bit line $W_{BL}$ 412 to induce SOT for the write operation.

Each of the $I_{D0}$ and $I_{D1}$ branches of the write circuit 226 comprises a PMOS and an NMOS connected in series. For the branch carrying current $I_{D0}$, the PMOS gate terminal 436 is connected to D 432 and the NMOS gate terminal 438 is connected to Q 430. In a cross-connection fashion, the PMOS gate terminal 440 of the branch carrying current $I_{D1}$ is connected to Q 430, and the PMOS gate terminal 436 is connected to D 432. The purpose of this cross connection is to produce a high '1' $I_{FB}$ current when there is a mismatch between D and Q.

The logical relation explaining the SOT inducing $I_{FB}$ feedback current in terms of D and Q is summarized in Table I in FIG. 7. When there is a mismatch such that D='0' and Q='1', $I_{D0}$ provides the high current component to $I_{FB}$ by turning on both PMOS and NMOS in this branch. In this case, the $I_{D1}$ branch carries a minimal '0' current, as both the PMOS and NMOS are turned off in this branch. Similarly, when there is a mismatch such that D='1' and Q='0', $I_{D1}$ is high and $I_{D0}$ is low.

When stored data Q is equivalent to the incoming data D, the memory state of the selected bit cell does not need to toggle, and the toggle switching current is therefore low '0' $I_{FB}$ value. For example, in the D='0' and Q='0' match condition, the NMOS in the $I_{D0}$ branch and the NMOS in the $I_{D1}$ branch are both turned off, resulting in $I_{D0}$, $I_{D1}$, and $I_{FB}$ exhibiting low '0' values. For the D='1' and Q='1' match condition, the PMOS in the $I_{D0}$ branch and the PMOS in the $I_{D1}$ branch are both turned off, which similarly prevents the toggle switching current from producing a high '1' $I_{FB}$ SOT.

The analog feedback process pushes Q to match D for a mismatch condition. A high '1' $I_{FB}$ current starts flowing through the heavy metal layer 103 of the selected bit cell 402 and starts a toggle write cycle. Initially, the SOT field-like component of $\vec{B}_{net}$ proportional to the $I_{FB}$ current value dominates over the PMA field component. As the free ferromagnet magnetization starts toggling, the MTJ resistance as well as the voltage divider output at node O 428 dynamically change to match the voltage level at node Q 430 with incoming data D 432. With the voltage difference between D and Q decreasing, the magnitude of the SOT-inducing $I_{FB}$ current gradually decreases and causes the PMA field component to dominate over the SOT field-like component. Therefore, the free ferromagnet relaxes along the toggled easy direction. As soon as Q matches D, the cycle is completed by self-terminating the feedback $I_{FB}$ current.

The single-bit simulation of FIG. 6 demonstrates four write operation cycles for the match and mismatch conditions summarized in Table I in FIG. 7. For those write four cycles, both $R_{WL}$ and $W_{WL}$ are simultaneously activated with 0 V ('0') and 1.1 V ('1'), respectively. During write cycle 1, due to the D=Q='0' match condition, the stored data Q does not need to toggle. $I_{SOT}$ is therefore a low '0', and $m_z$ remains at the initial value of −1. Before write cycle 2, D becomes '1'. This causes the D='1' and Q='0' mismatch condition, which increases the $I_{SOT}$ value to high '1' as write cycle 2 starts. Therefore, Q sharply switches from '0' to '1'; physically, this transition is manifested by $m_z$ switching from −1 to +1. The self-terminating nature of the feedback current $I_{SOT}$ is proven by the narrow current spike which abruptly ceases as Q matches D. During write cycle 3, there is a D=Q='1' match condition. Therefore, Q does not need to toggle and the $I_{SOT}$ value is a low '0'. Before write cycle 4, D becomes '0', which results in a D='0' and Q='1' mismatch as the write cycle begins. Therefore, $I_{SOT}$ goes high '1', which toggles Q from '0' to '1' and causes the toggle switching current to self-terminate; physically, $m_z$ switches from +1 to −1 during this second toggle switching process.

As can be seen in FIG. 6, Q saturates to logical '1' or '0' and the SOT-inducing write current ceases within 350 ps due to the self-terminating mechanism. Furthermore, this self-terminating feature greatly improves the energy efficiency of the write operation, as no energy is consumed when it is not needed. Additionally, this high speed permits operation at a 1 GHz clock frequency with 50% duty cycle (0.5 ns active clock period), as less than 350 ps is required to perform the write operation. The proposed MRAM architecture of the illustrative embodiments is therefore significantly faster than the 10 ns write duration limit required for L3 cache.

As the analog feedback process for the write operation requires the application of only $V_{dd}$ and GND voltages, the memory architecture does not require multiplexing among different multi-level analog supply voltages. The write circuit intrinsically performs the mismatch check between D and Q; no overhead circuit is necessary for write error detection and correction. Moreover, the self-terminating feature and '0' feedback current during a D-Q match help prevent memory wear-out and further improve energy efficiency.

Figure 8:
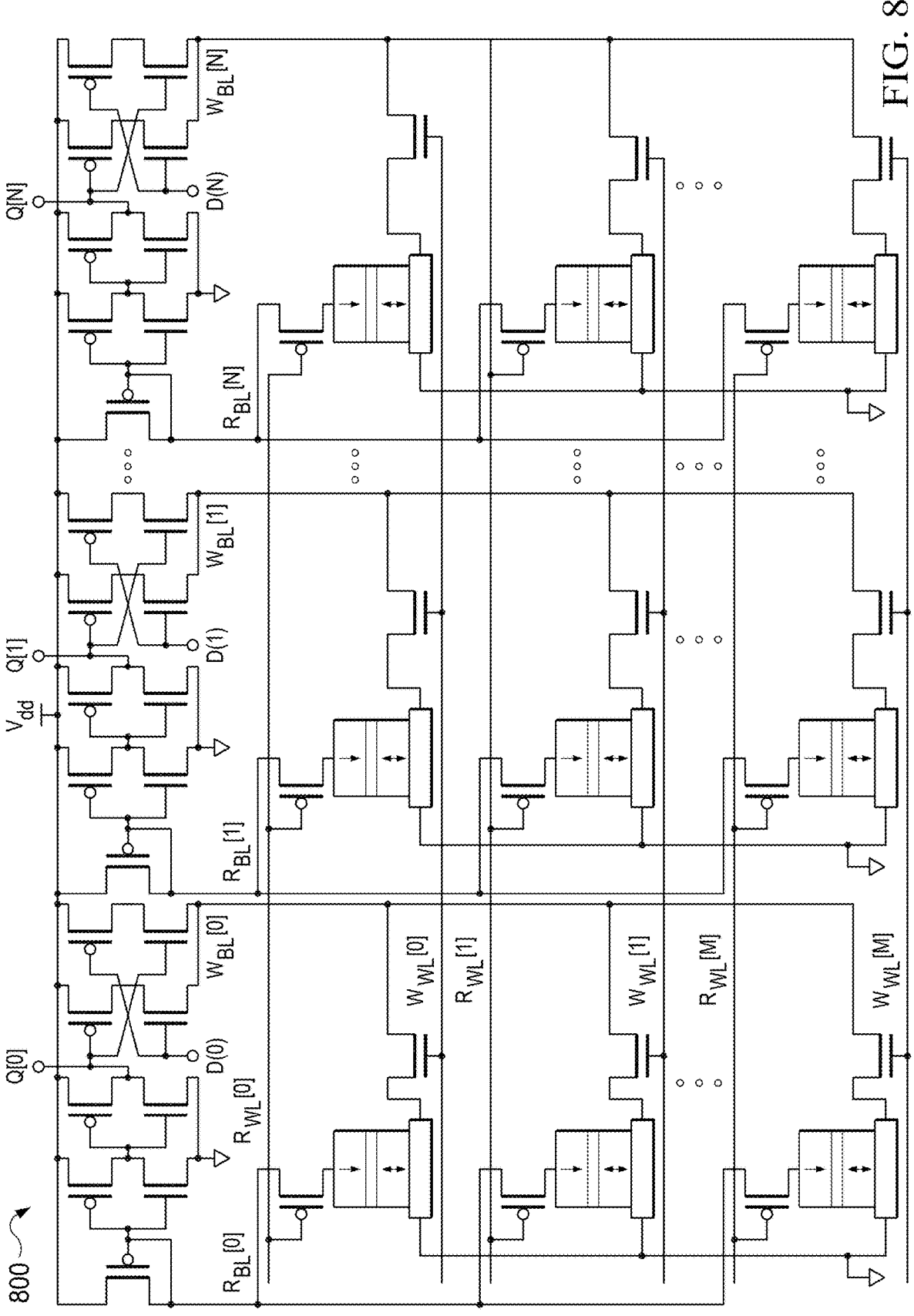
FIG. 8 depicts a diagram of a memory array architecture comprising multiple toggle SOT-MRAM bit cells and read-write drivers in accordance with an illustrative embodiment.

FIG. 8 depicts a diagram of a memory array architecture comprising multiple toggle SOT-MRAM bit cells and read-write drivers in accordance with an illustrative embodiment. The dimension of the array 800 is M×N, where M and N represent the numbers of rows and columns, respectively. As illustrated, bit cells in each column share one single driver cell through the common bit lines. For read and write operations, the array 800 is accessed in a row-wise manner by activating the relevant word line signals with a standard address decoder.

As this architecture permits the read and write within a single clock cycle, there is a drastic reduction in write delay relative to prior approaches. As mentioned above, other toggle memory approaches are hampered by a delay of two clock cycles due to the need to read before write. The single cycle write operation enabled by the analog feedback mechanism of the illustrative embodiments circumvents the need for two clock cycles.

To evaluate the functional correctness of the proposed architecture, a SPICE-compatible Verilog-A model was developed that incorporates both the micromagnetic and electrical behavior of toggle SOT-MRAM. The model is validated against a conventional micromagnetic simulator, mumax3.

The toggle switching of the MTJ free ferromagnet by SOT is modeled as the rate of magnetization change, $$\frac{dm_z}{dt} = C_{SOT} I_{SOT}(m_{z,th} - m_z) + C_K(m_{ea} - m_z)$$

where $m_z$ is the perpendicular z-axis component of the free ferromagnet magnetization, $C_{SOT}$ is a fitting parameter that models the SOT excitation, $I_{SOT}$ is the SOT current, $C_K$ accounts for the relaxation procedure physically controlled by PMA, $M_{z,th}$ models the stable intermediate state induced by a constant SOT excitation discussed above, $M_{ea}$ represents the PMA easy axis direction, and t is time.

The analog MTJ resistance $R_{MTj}$ is modeled as $$R_{MTJ} = \frac{2R_{AP}R_P}{R_{AP} + R_P + (R_{AP} - R_P)\cos\theta}$$

where $R_{AP}$ and $R_P$ represent the anti-parallel and parallel resistance states, respectively, and $\theta$ represents the angular difference between the magnetic orientations of the free and fixed ferromagnets. $\cos\theta$ can be determined by the dot product between free and fixed ferromagnet magnetization vectors and can be simplified as $m_z m_{fixed}$, where $m_{fixed}$ represents the magnetization of the fixed ferromagnet.

Figure 9:
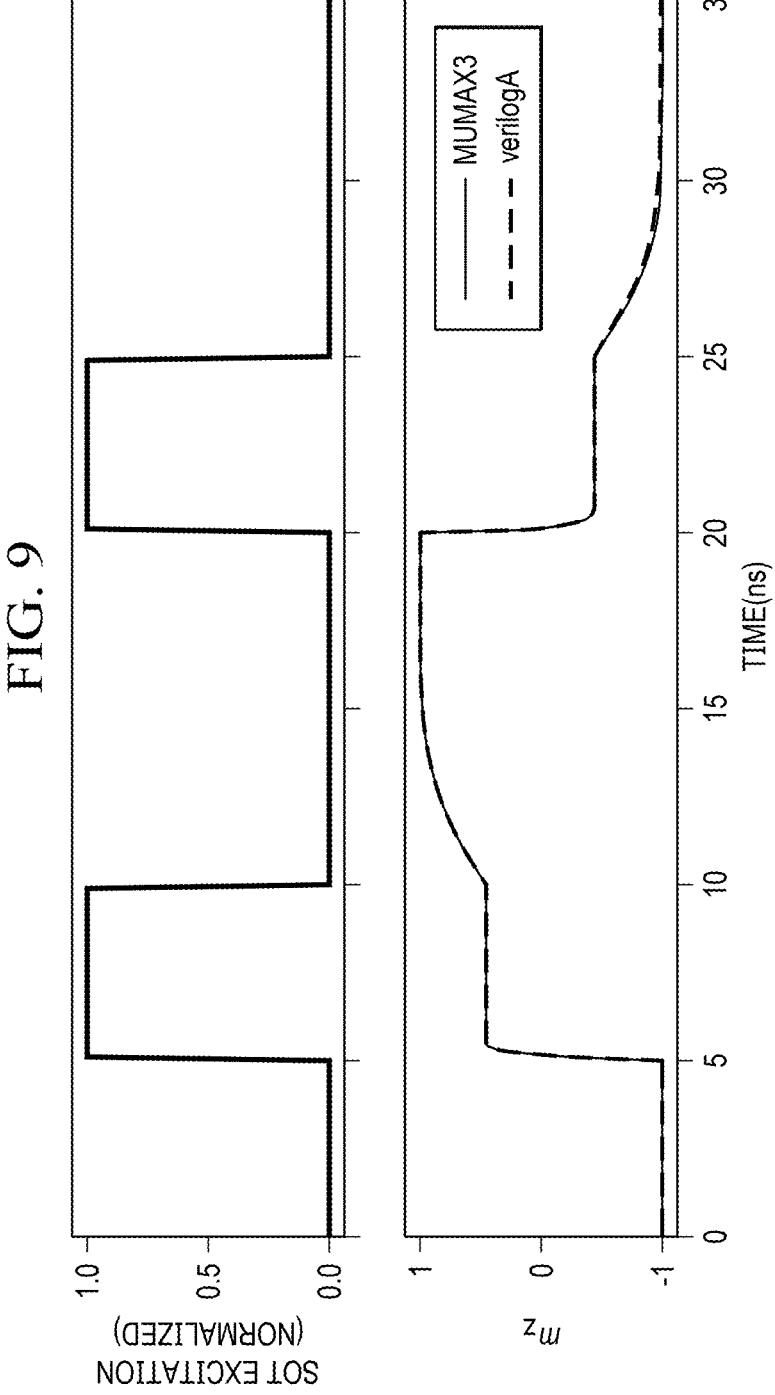
FIG. 9 depicts graph illustrating validation of magnetization dynamics modeled with Verilog-A against mumax3 micromagetic simulation in accordance with an illustrative embodiment.

FIG. 9 depicts graph illustrating validation of magnetization dynamics modeled with Verilog-A against mumax3 micromagetic simulation in accordance with an illustrative embodiment. The parameters of the simplified model are optimized to match the mumax3 micromagnetic simulation. As shown in FIG. 9, the Verilog-A model fits the magnetization dynamics of an SOT excited free ferromagnet with negligible mismatch. This simulation is for $I_{SOT}$=300 μA with a fitting parameter set $C_{SOT}=3.0\times10^{13}$, $C_K=4.5\times10^8$, $m_{z,th}=0.42$, 30 nm diameter, 1.2 nm thickness with saturation magnetization 1.3 T, effective PMA magnetic field 230 mT, Gilbert damping parameter 0.02, and SOT field-to-damping component ratio of 3.

The circuit simulations to validate the functional correctness of the proposed memory architecture are based on the VerilogA model described above, while the peripheral CMOS circuits are designed in the UMC 65 nm technology node. The circuit parameters for the simulation are shown in Table II in FIG. 10.

As used herein, the phrase "a number" means one or more. The phrase "at least one of", when used with a list of items, means different combinations of one or more of the listed items may be used, and only one of each item in the list may be needed. In other words, "at least one of" means any combination of items and number of items may be used from the list, but not all of the items in the list are required. The item may be a particular object, a thing, or a category.

The description of the different illustrative embodiments has been presented for purposes of illustration and description and is not intended to be exhaustive or limited to the embodiments in the form disclosed. Many modifications and variations will be apparent to those of ordinary skill in the art. Further, different illustrative embodiments may provide different features as compared to other desirable embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. A non-volatile magnetoresistive random-access memory device, comprising:

at least one three-terminal spin-orbit torque magnetic tunnel junction (MTJ) with perpendicular anisotropy, wherein the MTJ comprises a fixed ferromagnetic layer, a free ferromagnetic layer, a tunnel barrier between the fixed and free ferromagnetic layers, and a heavy metal layer under the free ferromagnetic layer opposite the tunnel barrier;

a read access transistor connected to a first terminal connected to the fixed magnetic layer;

a write access transistor connected to a second terminal connected to the heavy metal layer;

a ground voltage connected to a third terminal connected to the heavy metal layer;

a read bit line connected to the read access transistor;

a read word line connected to the gate of the read access transistor;

a write bit line connected to the write access transistor;

a write word line connected to the gate of the write access transistor; and a driver circuit, comprising:

a read circuit that reads data from the MTJ as an analog voltage through the read bit line, according to a resistance state of the MTJ;

a buffer circuit comprising inverters that amplify the analog voltage to logical 1 or 0, corresponding to the resistance state of the MTJ being high or low, respectively; and a write circuit that writes incoming data to the MTJ when the incoming data is logically opposite to the resistance state of the MTJ, wherein the write circuit produces a self-terminating feedback current that induces spin orbit torque to switch the resistance state of the MTJ.

2. The device of claim 1, wherein the read access transistor comprises a PMOS transistor.

3. The device of claim 1, wherein the write access transistor comprises an NMOS transistor.

4. The device of claim 1, wherein the MTJ is read and written to in a single clock cycle.

5. The device of claim 1, wherein the MTJ is read by application of a binary 0 signal to the read word line and application of a binary 0 signal to the write word line, causing a value stored in the MTJ to be propagated to the read bit line.

6. The device of claim 1, wherein the MTJ is written to by application of a binary 0 signal to the read word line and application of a binary 1 signal to the write word line.

7. A non-volatile magnetoresistive random-access memory array, comprising:

a number of rows and columns of three-terminal spin-orbit torque magnetic tunnel junctions (MTJs) with perpendicular anisotropy, wherein each MTJ comprises a fixed ferromagnetic layer, a free ferromagnetic layer, a tunnel barrier between the fixed and free ferromagnetic layers, and a heavy metal layer under the free ferromagnetic layer opposite the tunnel barrier;

ground voltage connected to all the heavy metal layers of MTJs in the array;

a number of read bit lines connected to MTJs in the same columns of the array, wherein the read bits lines are connected to read access transistors connected to the fixed ferromagnetic layers of the MTJs;

a number of read word lines connected to MTJs in the same rows of the array, wherein the read bits lines are connected to gates of the read access transistors;

a number of write bit lines connected to MTJs in the same columns of the array, wherein the write bit lines are connected to write access transistors connected to the heavy metal layers of the MTJs;

a number of write word lines connected to MTJs in the same rows of the array, wherein the write bit lines are connected to gates of the write access transistors; and a driver circuit for each column of MTJs in the array, wherein each driver circuit comprises:

a read circuit that reads data from the MTJs as an analog voltage through the read bit line, according to resistance states of the MTJs;

a buffer circuit comprising inverters that amplify the analog voltage to logical 1 or 0, corresponding the resistance states of the MTJs being high or low, respectively; and a write circuit that writes incoming data to the MTJs when the incoming data is logically opposite to the resistance states of the MTJs, wherein the write circuit produces a self-terminating feedback current that induces spin orbit torque to switch the resistance states of the MTJs.

8. The array of claim 7, wherein application of a binary 0 signal to a single read word line simultaneous to application of binary 1 signals to all other read word lines and application of binary 0 signals to all write word lines causes the values stored in the row of MTJs selected by the single word line with a binary 0 signal to be propagated to the read bit lines.

9. The array of claim 8, wherein a stored word is read by activating a row of MTJs.

10. The array of claim 8, wherein a row of the array is read within a single clock cycle.

11. The array of claim 7, wherein application of a binary 0 signal to the read word line of a selected row of MTJs and application of a binary 1 signal to the write word line of the selected row, simultaneous to application of binary 1 signals to all other read word lines and application of binary 0 signals to all other write word lines causes values present at data inputs to be stored in the selected row of MTJs.

12. The array of claim 11, wherein a word is written to a row of MTJs in the array.

13. The array of claim 11, wherein a row of the array is written to within a single clock cycle.

14. The array of claim 7, wherein the read access transistors comprise PMOS transistors.

15. The array of claim 7, wherein the write access transistors comprise NMOS transistors.

16. A method of reading from a magnetoresistive random-access memory array, the method comprising:

applying a binary 0 signal to a single read word line connected to a selected row of magnetoresistive memory cells among a number of rows and columns of magnetoresistive memory cells in the array;

applying binary 1 signals to respective read word lines connected to the other rows of magnetoresistive memory cells in the array; and applying binary 0 signals to respective write word lines connected to all the rows of magnetoresistive memory cells in the array;

wherein each magnetoresistive memory cell comprises:

a three-terminal spin-orbit torque magnetic tunnel junction (MTJ) with perpendicular anisotropy, wherein the MTJ comprises a fixed ferromagnetic layer, a free ferromagnetic layer, a tunnel barrier between the fixed and free ferromagnetic layers, and a heavy metal layer under the free ferromagnetic layer opposite the tunnel barrier;

a read access transistor connected to a first terminal connected to the fixed magnetic layer, to a read bit line common to a column of the magnetoresistive memory cells, and to one of the read word lines at its gate;

a write access transistor connected to a second terminal connected to the heavy metal layer, to a write bit line common to the column of the magnetoresistive memory cells, and to one of the write word lines; and a driver circuit, comprising:

a read circuit that reads data from the MTJ as an analog voltage through the read bit line, according to a resistance state of the MTJ;

a buffer circuit comprising inverters that amplify the analog voltage to logical 1 or 0, corresponding to the resistance state of the MTJ being high or low, respectively; and a write circuit that writes incoming data to the MTJ when the incoming data is logically opposite to the resistance state of the MTJ, wherein the write circuit produces a self-terminating feedback current that induces spin orbit torque to switch the resistance state of the MTJ.

17. A method of writing to a magnetoresistive random-access memory array, the method comprising:

applying a binary 0 signal to a single read word line connected to a selected row of magnetoresistive memory cells among a number of rows and columns of magnetoresistive memory cells in the array;

applying a binary 1 signal to a write word line connected to the selected row of magnetoresistive memory cells;

applying binary 1 signals to respective read word lines connected to the other rows of magnetoresistive memory cells in the array; and applying binary 0 signals to respective write word lines connected to all the other rows of magnetoresistive memory cells in the array;

wherein each magnetoresistive memory cell comprises:

a three-terminal spin-orbit torque magnetic tunnel junction (MTJ) with perpendicular anisotropy, wherein the MTJ comprises a fixed ferromagnetic layer, a free ferromagnetic layer, a tunnel barrier between the fixed and free ferromagnetic layers, and a heavy metal layer under the free ferromagnetic layer opposite the tunnel barrier;

a read access transistor connected to a first terminal connected to the fixed magnetic layer, to a read bit line common to a column of the magnetoresistive memory cells, and to one of the read word lines at its gate;

a write access transistor connected to a second terminal connected to the heavy metal layer, to a write bit line common to the column of the magnetoresistive memory cells, and to one of the write word lines; and a driver circuit, comprising:

a read circuit that reads data from the MTJ as an analog voltage through the read bit line, according to a resistance state of the MTJ;

a buffer circuit comprising inverters that amplify the analog voltage to logical 1 or 0, corresponding to the resistance state of the MTJ being high or low, respectively; and a write circuit that writes incoming data to the MTJ when the incoming data is logically opposite to the resistance state of the MTJ, wherein the write circuit produces a self-terminating feedback current that induces spin orbit torque to switch the resistance state of the MTJ.

* * * * *